United States Patent

Liu et al.

[11] Patent Number: 6,045,767
[45] Date of Patent: Apr. 4, 2000

[54] CHARGE FOR VERTICAL BOAT GROWTH PROCESS AND USE THEREOF

[75] Inventors: Xaio Liu, Fremont; Meng Zhu, Oakland, both of Calif.

[73] Assignee: American Xtal Technology, Fremont, Calif.

[21] Appl. No.: 08/975,746

[22] Filed: Nov. 21, 1997

[51] Int. Cl.$^7$ ................................................. C01B 33/26
[52] U.S. Cl. ........................ 423/328.1; 117/81; 117/83; 252/63.3 GA
[58] Field of Search ............................. 117/81, 83, 200, 117/204, 205; 252/62.3 GA; 423/528.2

[56] References Cited

U.S. PATENT DOCUMENTS

| | | | |
|---|---|---|---|
| 4,999,082 | 3/1991 | Kremer et al. | 252/62.3 GA |
| 5,342,475 | 8/1994 | Yoshida et al. | 117/83 |
| 5,454,346 | 10/1995 | Uchida et al. | 117/13 |

FOREIGN PATENT DOCUMENTS

803593A1  10/1997  European Pat. Off. .
02074597  3/1990  Japan .
2034597   5/1990  Japan .
406128096 5/1994  Japan .

OTHER PUBLICATIONS

"Low–Dislocation–Density and Low–Residual–Strain Semi–Insulating GaAs Grown by Vertical Boat Method", Kawase, et al; 1996 IEEE Semi–Conducting and Semi–Insulating Materials Conference; Apr. 29, May 2/3, 1996 pp. 275–278.

"Semiconducting Gallium Argenide Single Crystals"; Yamamoto, et al., Japan, Kokai Tokkyo Koho, 5 pgs. (Abstract only), 1989.

*Primary Examiner*—Felisa Hiteshew
*Attorney, Agent, or Firm*—John C. Albrecht

[57] ABSTRACT

In vertical boat growth of GaAs single crystal ingots, graphite powder, in selected amounts, is included in the charge to establish directly related planned target electrical characteristics in the as grown ingots. The electrical characteristics correspond to concentrations of carbon in the as grown ingots.

8 Claims, 1 Drawing Sheet

CHARGE FOR VERTICAL BOAT GROWTH PROCESS AND USE THEREOF

TECHNICAL FIELD

This invention relates to improvements in the growth of single crystal semi-insulating GaAs ingots.

BACKGROUND OF THE INVENTION

Single crystal ingots of commercial interest are generally grown by one of the following processes: (a) Vertical Gradient Freeze (VGF), (b) Vertical Bridgeman (VB), (c) Horizontal Bridgeman (HB), and (d) Liquid Encapsulated Czochralski (LEC). Wafers produced by VGF, VB, and HB can produce "Low Defect Density" (LDD) material; and LEC by its nature produces only "High Defect Density" (HDD) material. By definition, LDD material is characterized herein by etch-pit densities (EPD) in the order of $10^2$ to $10^3$ dislocations/cm$^3$; and HDD material is characterized by higher EPD in the order of $10^4$ to $10^5$ dislocations/cm$^3$. The residual internal stress for crystals grown by LEC is substantially higher than in wafers produced by VGF, VB, and HB. The higher quality of the crystal and the lower residual internal stress of LDD material translates directly to advantages of less cracking when slicing wafers from an ingot, less breakage during wafer handling, better surface morphology, and a number of other properties which are desirable in producing end products, e.g., lasers, semiconductor circuits, etc.

Commercial suitability of a semi-insulating wafer is judged on the basis of controlled resistivity, uniform resistivity across a wafer, mobility, purity, EPD, flatness of wafers, etc. Commercial suitability of semi-insulating ingots for deriving such wafers is judged on the basis of its electrical properties, homogeneity from head to tail of the ingot, low residual internal stresses, and reproducible growth processes.

As seen below herein, controlled incorporation of carbon is a key factor in successful growth of semi-insulating GaAs materials. The semi-insulating electrical properties of GaAs are determined by the concentrations of: (a) residual donor impurities, e.g., Silicon; (b) acceptor impurities which comprise residual carbon in the poly-crystal material and carbon introduced as an acceptor impurity; and (c) EL2 which is a mid-gap intrinsic double donor defect which is related to the stoichiometry of GaAs material. An EL2 defect is associated with an As-on-Ga anti-site. Semi-insulating GaAs can only be achieved when the following relation is established: $N(EL2) > [N(a) - N(d)] > 0$, where $N(EL2)$ is the concentration of EL2 defects, $N(a)$ is the acceptor concentration, principally carbon, and $N(d)$ is the residual donor concentration, e.g., silicon, EL2 defect density and impurity control, especially the control of acceptors, are critical to achieving suitable semi-insulating properties in GaAs. Carbon is the main and most desirable acceptor; however, controlled incorporation of carbon has proved to be difficult.

In LEC, carbon mainly comes from two sources: (1) carbon is present as an impurity in the raw materials, and (2) carbon contamination comes from the hot graphite furnace components during growth. Semi-insulating GaAs with resistivity greater $10^7$ Ω-cm can generally be produced by LEC without significant difficulty. To achieve control of carbon in LEC, different carbon sources have been investigated, such as barium carbonate and carbon monoxide. So far, using CO is almost the standard in achieving carbon control in LEC. However, controlling the semi-insulating property of resistivity at less than $10^7$ Ω-cm is very difficult in LEC, since LEC has much higher background carbon level than VGF.

In HB, due to the high level of Si contamination from quartz, it is almost impossible to achieve semi-insulating GaAs by satisfying the condition of $N(EL2) > [N(a) - N(d)] > 0$. However, semi-insulating HB materials can be achieved by intentional doping with Chromium.

In VGF and VB, carbon level is normally low in the crystals grown, i.e., approximately low $10^{14}$/cm$^3$. Incorporation of carbon in VGF, and in VB is much more difficult than in LEC; and incorporation of carbon therein by use of CO is not practical. Incorporation of Carbon into the crystal is difficult because of the low solubility of Carbon in GaAs. Although the condition of $N(EL2) > [N(a) - N(d)] > 0$ can be satisfied by carefully minimizing the residual donor concentration, only limited semi-insulating properties of GaAs can be achieved. The resulting low level of balance between EL2, the donor impurities and acceptor impurities in such material is not desired since the materials tend to be unstable.

Although it has been possible to achieve limited semi-insulating properties in as grown VB and VGF GaAs ingots, there are no standard ways of controlled incorporation of carbon into GaAs ingots, particularly to achieve high carbon concentrations, e.g., greater than $10^{16}$ atoms/cm$^3$ and higher.

In the prior art there are many references to carbon doping of GaAs ingots during growth by a use of a variety of carbon compounds, e.g., barium carbonate or carbon monoxide. A paper entitled *Low-dislocation-density and Low-residual-strain Semi-insulating GaAs as Grown by Vertical Boat Method* by T. Kawase, et. al. reports achieving good control of carbon incorporation in GaAs ingots by use of a "carbon source" in a pBN crucible charged with GaAs poly-crystal material. Since the "carbon source" is not identified in that paper, it is unknown how the reported results are achieved.

DISCLOSURE OF THE INVENTION

Use of our improved charge in vertical boat processes, as described herein, results in low defect density (LDD), semi-insulating GaAs ingots with electrical characteristics specifically tailored to intended end uses of wafers derived from such ingots.

Our improved charge for vertical boat growth of a GaAs ingot, in addition to poly-crystal GaAs material, comprises graphite powder in a selected amount corresponding to the target electrical characteristics of the ingot.

The nominal doping potential of the selected amount of graphite powder included in a charge is large compared to the planned target level of carbon dopant in the as grown ingot.

Wafers derived from ingots grown in accordance with our invention are highly suitable for post processing applications which include direct ion implantation into the substrate.

Our invention may be practiced equally well in VGF and VB apparatus.

DETAILED DESCRIPTION

Figure 1:
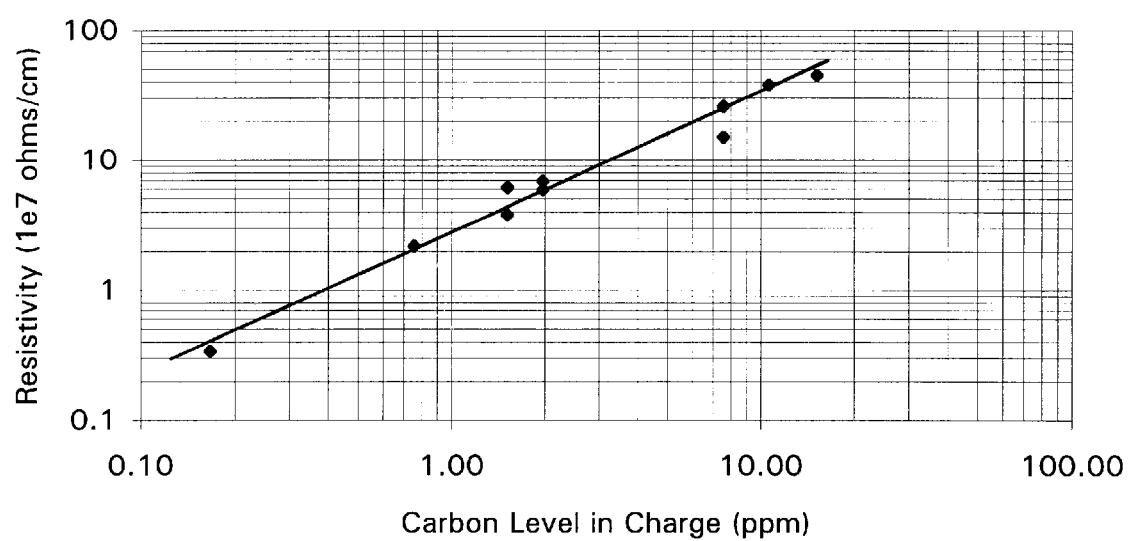
FIG. 1 is an plot of the resistivities of several GaAs ingots as a function of relative carbon doping in the corresponding growth charges.

By way of example, in VGF, GaAs ingots are grown in a pyrolitic boron nitride (pBN) crucible which has been charged with pre synthesized GaAs poly-crystal material over a properly oriented seed crystal. The pBn crucible is placed in a closed quartz tube. The charge material and a portion of the seed, through a controlled heating pattern, are melted, and thereafter the melt is sequentially frozen to form a single crystal ingot corresponding in orientation to that of the seed crystal. Optionally, the crucible is also charged with $B_2O_3$ which serves as a spacer between the crucible and the ingot as it grows; and a spacer between the seed and the seed well.

In accordance with our present invention, graphite powder, as a specific source of carbon, is loaded into the crucible together with a poly-crystal GaAs material to form our improved charge; the crucible is placed in a closed quartz tube; and heating of the charge is initiated. The quantity of graphite powder included in the improved charge is selected to provide a nominal doping level potential substantially in excess of the planned target level of carbon in the as grown ingot. For example, an amount of graphite powder with a nominal C-doping level of approximately $10^{17}$ atoms/cm$^3$ has served to dope Carbon to an approximate planned target level of $10^{15}$ atoms/cm$^3$ in the as grown ingot. Other high values of nominal C doping levels, e.g., approximately $10^{18}$ each result in a corresponding target Carbon level, e.g., $10^{16}$ atoms/cm$^3$. In accordance with our invention, the nominal potential doping level of graphite powder included in a GaAs charge to grow a semi-insulating GaAs ingot is at least several times the planned target level of carbon to be incorporated in the ingot.

The improved charge is heated to the melting point of GaAs; and is held at that temperature for a period of time e.g., an hour, more or less, to promote dissolution of the graphite in the GaAs melt. The large contact surface area presented to the GaAs melt by the large amount of graphite powder is key to successful uniform incorporation of carbon in the grown crystal. During growth, only a small amount of the carbon is incorporated in the crystal; and the remainder is harmlessly swept to the tail end of the ingot as growth proceeds. The incremental rate of incorporation of carbon into the grown crystal reduces over the period of time that the melt is held at the melting point.

Upon completion of growth, the ingot is cooled to room temperature; and the small portion of the tail which includes the excess graphite is cut off.

FIG. 1 is a plot of resistivity of eight sample GaAs ingots grown as described herein as a function of the relative carbon dopant included in the charges for these ingots. As seen in FIG. 1, by use of our novel charge which includes graphite powder, the resistivity of VGF grown GaAs semi-conducting material can be tuned over more than two-orders of magnitude, from low $10^6$ Ω-cm to high $10^8$ Ω-cm.

The results described herein are based on use of graphite powder of particular properties, e.g., granularity, humidity, etc.; and of particular patterns of operating temperatures. It is to be expected that use of finer or coarser graphite powder will affect the relations between nominal doping levels and the resulting target levels. Similarly, different patterns of operating temperatures may affect those relationships.

The invention has been described with particular attention to its preferred embodiment; however, it should be understood that variations and modifications within the spirit and scope of the invention may occur to those skilled in the art to which the invention pertains.

What is claimed is:

1. A charge for use in vertical boat growth of GaAs single crystal ingots comprising: poly-crystal GaAs material; a source of carbon; and Boron Oxide characterized in that said source of carbon comprises graphite powder; the nominal doping potential of said graphite powder included in the charge is large compared to the planned target level of carbon dopant in an as grown ingot, and said Boron Oxide is provided in an amount for providing spacer material between an as grown ingot and a crucible wall and between a seed crystal and a seed well.

2. A charge in accordance with claim 1 characterized in that the nominal doping potential of said graphite powder included in the charge is the order of 100 times the planned target level of carbon dopant in an as grown ingot.

3. A charge in accordance with claim 1 characterized in that the nominal doping potential of said graphite powder included in the charge is at least several times the planned target level of carbon dopant in an as grown ingot.

4. Vertical boat growth of single crystal, semi-insulating GaAs ingots having controlled planned target levels of Carbon therein comprising: (a) loading a crucible with a charge of poly-crystal GaAs material; a source of carbon; and Boron Oxide over a selectively oriented seed crystal; (b) placing said crucible in a closed quartz tube; (c) applying a controlled pattern of heating to melt the charge and a portion of the seed crystal to sequentially freeze the melt starting at the interface with the seed crystal to form a single crystal;

characterized in that said source of carbon is graphite powder in a selected quantity having a defined large nominal doping potential compared to the planned target level of Carbon in an as grown ingot; and said Boron Oxide is provided in an amount for providing spacer material between an as grown ingot and a crucible wall and between a seed crystal and a seed well.

5. Vertical boat growth of single crystal, semi-insulating GaAs ingots in accordance with claim 4 characterized in that said pattern of heating comprises: heating said charge to the melting point temperature of GaAs; holding that temperature for a period of time.

6. Vertical boat growth of single crystal, semi-insulating GaAs ingots in accordance with claim 4 characterized in that the nominal doping potential of said graphite powder included in the charge is the order of 100 times the planned target level of carbon dopant in an as grown ingot.

7. Vertical boat growth of single crystal, semi-insulating GaAs ingots in accordance with claim 4 characterized in that the nominal doping potential of said graphite powder included in the charge is at least several times the planned target level of carbon dopant in an as grown ingot.

8. Semi-insulating mono crystalline GaAs material produced in accordance with any of the claims 4, 5, 6 and 7.

* * * * *

Adverse Decision In Interference

Patent No. 6,045,767, Xiao Liu, Meng Zhu, CHARGE FOR VERTICAL BOAT GROWTH PROCESS AND USE THEREOF, Interference No. 105,237, final judgment adverse to the patentees rendered December 20, 2004, as to claims 1-8.

*(Official Gazette February 22, 2005)*